United States Patent
Prymak

(10) Patent No.: US 7,068,490 B2
(45) Date of Patent: Jun. 27, 2006

(54) THERMAL DISSIPATING CAPACITOR AND ELECTRICAL COMPONENT COMPRISING SAME

(75) Inventor: John D. Prymak, Greer, SC (US)

(73) Assignee: Kemet Electronics Corporation, Greenville, SC (US)

(*) Notice: Subject to any disclaimer, the term of this patent is extended or adjusted under 35 U.S.C. 154(b) by 0 days.

(21) Appl. No.: 10/826,605

(22) Filed: Apr. 16, 2004

(65) Prior Publication Data

US 2005/0231890 A1    Oct. 20, 2005

(51) Int. Cl.
  *H01G 4/228*   (2006.01)
  *H01G 4/20*    (2006.01)
  *H01G 4/005*   (2006.01)

(52) U.S. Cl. .................. 361/306.3; 361/312; 361/766; 361/303

(58) Field of Classification Search ............... 361/303, 361/301.4, 306.1, 306.2, 306.3, 308.1, 309, 361/311, 312, 313, 765–766, 782
See application file for complete search history.

(56) References Cited

U.S. PATENT DOCUMENTS

| | | | |
|---|---|---|---|
| 4,831,494 A | 5/1989 | Arnold et al. ............... 361/306 |
| 4,982,485 A * | 1/1991 | Nakaya et al. ............. 29/25.42 |
| 5,666,272 A | 9/1997 | Moore et al. ............... 361/735 |
| 5,893,724 A | 4/1999 | Chakravorty et al. ....... 438/108 |
| 5,905,633 A | 5/1999 | Shim et al. .................. 361/704 |
| 5,973,907 A | 10/1999 | Reed ....................... 361/306.1 |
| 5,982,635 A * | 11/1999 | Menzies et al. ............. 361/790 |
| 6,097,609 A | 8/2000 | Kabadi ........................ 361/760 |
| 6,292,351 B1 * | 9/2001 | Ahiko et al. ............. 361/306.3 |
| 6,316,736 B1 | 11/2001 | Jairazbhoy et al. .......... 174/260 |
| 6,407,904 B1 | 6/2002 | Kuroda et al. ............... 361/303 |
| 6,459,561 B1 | 10/2002 | Galvagni et al. ......... 361/306.3 |
| 6,477,032 B1 | 11/2002 | Makl, Jr. .................. 361/306.3 |
| 6,496,355 B1 | 12/2002 | Galvagni et al. ......... 361/306.3 |
| 6,586,829 B1 | 7/2003 | Yaniv et al. ................. 257/693 |
| 6,631,540 B1 | 10/2003 | Mosley ....................... 29/25.42 |
| 6,700,794 B1 * | 3/2004 | Vinson et al. ............... 361/782 |
| 2004/0125540 A1 * | 7/2004 | Vieweg et al. ........... 361/306.3 |
| 2004/0223290 A1 * | 11/2004 | Sutardja ................... 361/306.3 |

FOREIGN PATENT DOCUMENTS

EP      1 220 246 A1    7/2002
JP      2001-155954  *  6/2001

* cited by examiner

Primary Examiner—Eric W. Thomas
(74) Attorney, Agent, or Firm—Joseph T. Guy; Nexsen Pruet, LLC

(57) ABSTRACT

An electrical component with a printed circuit board. The printed circuit board has an upper face and a lower face. A microprocessor is mounted to the upper face. A capacitor is mounted to the lower face. The capacitor has a first face parallel to the printed circuit board and a second face opposite to the first face. First plates and second plates are in alternating planar relationship with a dielectric therebetween and arranged in a plane perpendicular to the plane created by the circuit board. Each first plate has a first coupling tab and a power tab on opposing edges wherein the first coupling tab terminates at the first face and the power tab terminates at the second face. Each second plate of the second plates comprises a second coupling tab and a ground tab on opposing edges wherein the second coupling tab terminates at the first face and the ground tab terminates at the second face. The first coupling tab and the second coupling tab are in electrical contact with the microprocessor.

38 Claims, 5 Drawing Sheets

THERMAL DISSIPATING CAPACITOR AND ELECTRICAL COMPONENT COMPRISING SAME

FIELD OF THE INVENTION

The present invention is related to an interdigitated capacitor with improved physical properties and thermal pass-through capabilities. More specifically, the present invention is related to an electrical component comprising improved heat dissipative properties.

BACKGROUND OF THE INVENTION

Capacitors, particularly interdigitated capacitors, are well known in the art of electrical components. Capacitors typically comprise parallel plates, which act as charge collectors and sources, with a dielectric there between. The function of capacitors is well known and further discussion is not warranted herein.

The capacitors are elements that are added to the circuitry with primarily a singular function. The primary function being a source of energy for the circuit to function. In this application, it is counted on only as a reserve of energy hung on to the circuit traces, and in itself does not contribute to the circuit charge or discharge path. In many cases, traces have to be extended from the direct path of the power delivery to connect to the capacitor.

Capacitors are typically secured to a substrate as a component of an integrated circuit. A particularly relevant integrated circuit comprises a microprocessor (IC) mounted to a printed circuit board (as the IC carrier) with large value ceramic capacitors mounted on the opposite side of the printed circuit board in a sandwich type arrangement. This arrangement, while long utilized in the art, is now a limiting factor in the further ongoing miniaturization and speed increase of modern day circuitry. This arrangement is now limiting in two instances. One limitation is the propensity for larger ceramic capacitors to form cracks, and therefore fail, when subjected to flex stresses. Larger capacitors are required because of the higher capacitances required for this application. A second limitation is the necessity to dissipate heat from the circuit as increased functionality and speed increases heat in the silicon.

Stress cracking that is exacerbated with larger capacitors is well known: as the size of a capacitor increases the separation between terminations increases as does the susceptibility to cracking. Any flex in the substrate is therefore amplified in the larger separation relative to a small capacitor with close termination leads.

Heat is typically dissipated by thermal conduction from a component, such as a microprocessor, to a high surface area heat sink. In conventional integrated circuits a microprocessor and heat sink are on the opposite face of the printed circuit board from the capacitor. Heat dissipation is therefore only available on one side of the printed circuit board. Incorporating an additional heat sink path is not typically available because of circuit design limitations. Heat removal within the capacitor typically requires dissipation through the electrical connection to the microprocessor and then to the heat sink.

The present invention provides a novel capacitor, and integrated circuit arrangement, which decreases the propensity for stress fractures from flexing and allows for alternate paths of heat dissipation. The novel capacitor, and integrated circuit, achieves these previously unobtainable goals while still maintaining minimal inductance and resistance, with a potential for reduction of both of these parasitics from previous capabilities.

SUMMARY OF THE INVENTION

It is an object of the invention to provide a capacitor, which is less susceptible to stress fractures while contributing minimally to the total inductance of the capacitor or of an integrated circuit containing the capacitor.

It is another object of the invention to provide a capacitor, which facilitates heat dissipation in an integrated circuit without detrimental increases in inductance or resistance, and in a direction or path previously unavailable.

It is another object of the invention to provide a capacitor with a plane of the multiple internal electrode plates perpendicular to the normal arrangement of these planes. These rotated planes are presented in the device as being perpendicular to the plane created by both the silicon chip and the printed circuit board.

Another embodiment is provided in a ceramic capacitor comprising a multiplicity of termination points along the face in contact with the board, with small distances between the termination faces allowing a small gap of unsupported ceramic to improve the flex crack withstanding capability. The termination contacts are arranged in an interdigitated fashion such that adjacent, internal electrode plates are terminated to opposite contacts and non-adjacent plates, or every other plate, is terminated to like pads. This feature is also a contributing factor to the low inductance of the contacts since they are close together which minimizes the loop area.

Yet another embodiment is provided in an electrical component with multiple pads along the face opposite the face terminating to the bottom side of the IC circuit board, such that connection to the main computer board, or board that the IC board is normally affixed to, is accomplished through the capacitor matrix. It is herein where the power and ground electrical connections are now possible, and a path is now available for thermal propagation from the silicon, through the capacitor device to the main board of the final assembly. The power of ground connections can now be passed by vias in the main board to a large pad, to which a second heat spreading device, or heat sink, is mechanically attached.

Yet another embodiment is provided in a method for preparing a face termination capacitor. The process comprises the steps of:
a) forming a green chip comprising a ceramic precursor between parallel plates wherein each plate comprises at least one lead out tab;
b) firing the green chip to convert the ceramic precursor to ceramic thereby forming a capacitor subunit;
c) because the rotating planes limit the thickness of the green pad assembly, and width or depth apparent in the device, attaching the capacitor subunits to additional subunits by adhesive wherein the adhesive is parallel to the plates and could be used to create a singular assembly of multiples of these devices or a device of larger depth than the single element; and
d) forming external terminations on a face of the capacitor in electrical contact with the lead out tab.

Yet another embodiment is provided in an electrical component. The electrical component has a printed circuit board and a capacitor mounted to a surface of the printed circuit board. The capacitor comprises a multiplicity of parallel plates in planar relationship and perpendicular to the surface of the printed circuit board. Each plate terminates at a first face between the capacitor and the printed circuit board. A dielectric is between the parallel plates.

Yet another embodiment is provided in a method for preparing a face termination capacitor. The method comprises the steps of: a) forming a green chip comprising ceramic precursor between parallel plates wherein each plate comprises lead out tabs and the lead out tabs of alternating plates are aligned forming first aligned tabs and second aligned tabs; b) firing the green chip to convert the ceramic precursor to ceramic thereby forming a capacitor subunit; c) attaching the capacitor subunit to a second subunit by adhesive wherein the adhesive is parallel to the plates; d) forming a first external termination on a face of the capacitor in electrical contact with the first aligned tabs; and e) forming a second external termination on the face of the capacitor in electrical contact with the second aligned tabs.

Yet another embodiment is provided in a method for preparing a face termination capacitor. The method comprises the steps of: a) forming a green chip comprising ceramic precursor between parallel plates wherein each parallel plate of the parallel plates comprises lead out tabs and the lead out tabs of alternate plates are aligned to form first aligned tabs and second aligned tabs; b) attaching the green chip to a second green chip with the parallel plates in each green chip parallel to form a stacked green chip; c) firing the stacked green chip to convert the ceramic precursor to ceramic thereby forming a ceramic capacitor; d) forming first external terminations on a face of the ceramic capacitor in electrical contact with the first aligned tabs; and e) forming second external terminations on the face of the ceramic capacitor in electrical contact with the second aligned tabs.

A particularly preferred embodiment is provided in a capacitor comprising a pair of opposing faces. The capacitor further comprises subunits wherein each subunit comprises a multiplicity of first plates and second plates in alternating parallel relationship and perpendicular to the opposing faces. The first electrodes comprise first lead out tabs which terminate at a first external terminal at a first face. The second electrodes comprise second lead out tabs which terminate at a second external terminal at the first face. A first external terminal is in contact with the first lead out tabs and a second external terminal is in contact with the second lead out tabs. The subunits are arranged in parallel such that the first external terminals and the second external terminals are on the first face.

BRIEF DESCRIPTION OF THE DRAWINGS

FIG. 6d illustrates four subunits taken together to form the capacitor and FIG. 6e is an 'on end' view of the assembly.

DETAILED DESCRIPTION OF THE DRAWINGS AND INVENTION

The invention will be described with reference to the drawings, which form an integral part of the disclosure. In the various drawings, similar elements will be numbered accordingly.

Figure 1:
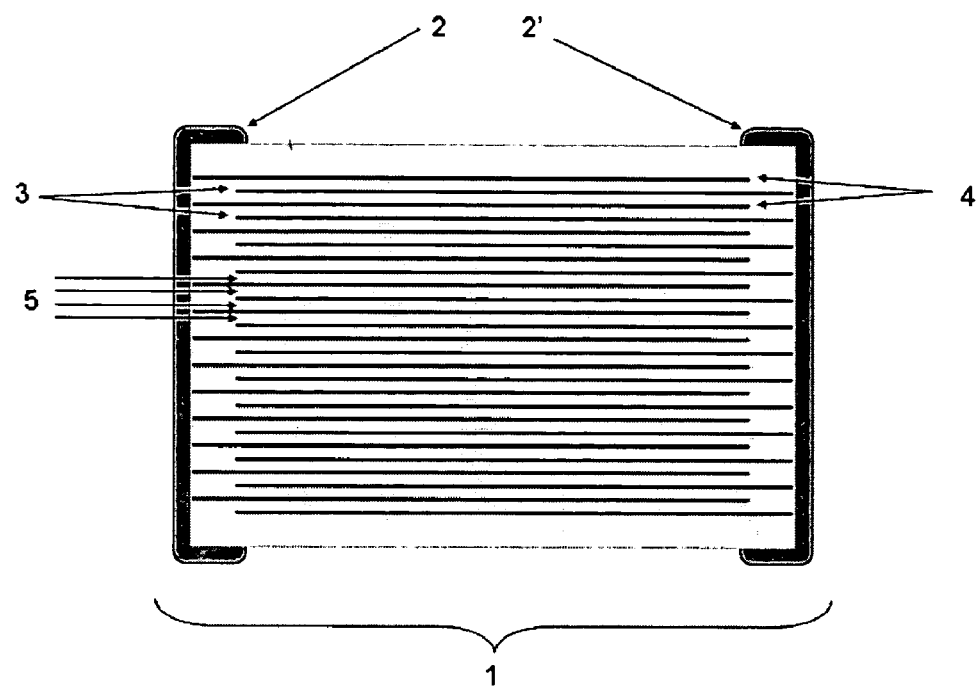
FIG. 1 is a cross-sectional view of a multilayer capacitor.

The configuration of multilayer capacitors is well known in the art. With reference to FIG. 1, an exemplary structure of a multilayer ceramic chip capacitor, 1, is shown. External electrodes, 2 and 2', forming the terminations of the capacitor, 1, are disposed on side surfaces of the capacitor block structure, 1, and in electrical connection to internal electrode layers, 3 and 4. The capacitor chip, 1, has a plurality of stacked electrode layers, 3 and 4, such that alternating electrodes extend to opposite external electrodes. A dielectric material, 5, interleaves these internal electrode layers such that they form an insulative and electrical field enhancement between the areas created by these overlapping electrode planes.

This structure could also be utilized in electrolytic capacitors where the dielectric would be formed as an anodization on each electrode plate, or alternate electrode plates, and the dielectric in this structure replaced by a conductive or semiconductive material. The electrode with the anodization would create the anode contact or termination, and the opposing termination would create the cathode termination. By anodizing adjacent electrode plates, a non-polar electrolytic could also be created. A desired capacitor circuit is completed in this way.

Figure 2:
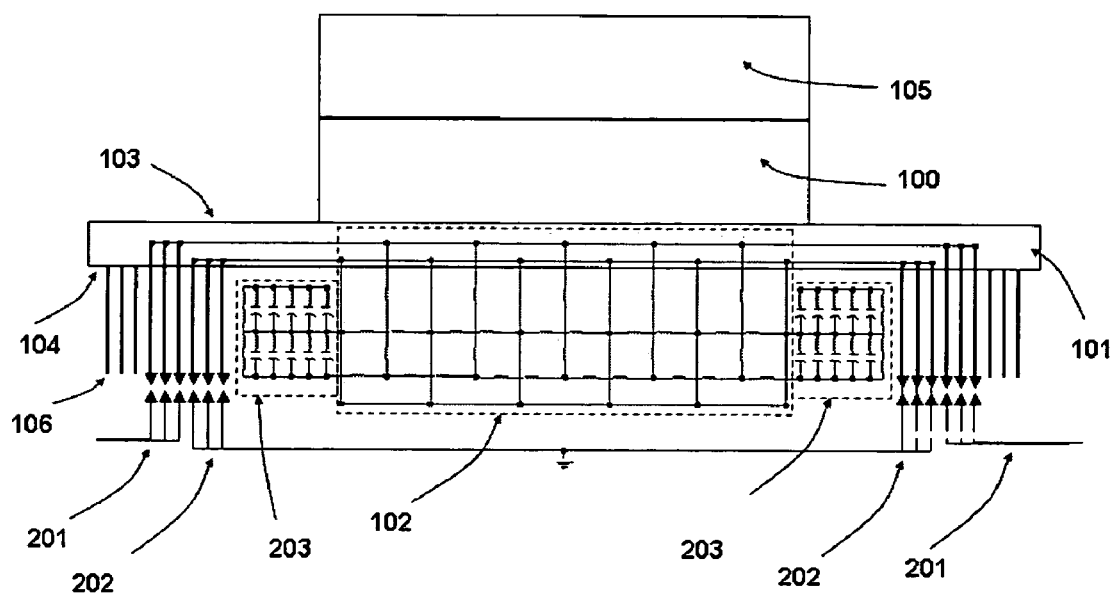
FIG. 2 is a schematic representing the present state of decoupling using multiple, low-inductance chips.

The present solutions for microprocessors involves a typical decoupling scheme as depicted in FIG. 2. Normally, the silicon microprocessor, 100, is mechanically and electrically bonded to the small chipboard, 101, along the top face, 103, of the chipboard. The chipboard, 101, allows the extremely tight connection matrix of the silicon at the top, 103, to spread out to a larger connection matrix through printed circuit traces within the layers of the chipboard, to the bottom face, 104, of the chipboard, 101. The silicon microprocessor, 100, in this manner allows a connection of a very high density interface matrix to a much lower density matrix on the mother board of the system through a series of pins (106) or solder balls along the bottom face, 104, of the chipboard, 101.

The power pins, 201, and ground pins, 202, feed these elements from the bottom face, 104, into the chipboard, 101, which connects to the bottom of the microprocessor, 100, along the top face, 103. The printed circuitry within the chipboard must interface the pin connections, 106, to the microprocessor, 100, along the top face, 103, and must allow for additional connections for decoupling capacitors, 203. These capacitors are surface mount, low-inductance (usually ceramic) chips connected in a matrix within a central area void of pins on the lower face, 104, or with an arrangement for these capacitors to be mounted on the top face, 103, in the perimeter area around the silicon, 100. This method of adding on capacitors creates the need for additional printed circuit wiring, 102, within the chipboard, 101, to create the extensions for power and ground decoupling contacts. Because the capacitors are on the bottom face, 104, or top face, 103, of the chipboard, 101, these internal interconnects must be brought to the surface of the chipboard, 101, through vias. It is typical to provide a heat sink, 105, which is a large area component to dissipate heat from the circuitry.

The additional trace lengths and the vias as added extensions, 102, of the circuit proper, add inductance to the system, which requires that the inductance be minimized. One solution to lower the inductance is to connect many capacitors in parallel, 203. As the number of capacitors increase, the overall inductance decreases. The area available for these capacitors is held constant or dwindling, demanding the need for smaller chips.

Figure 3:
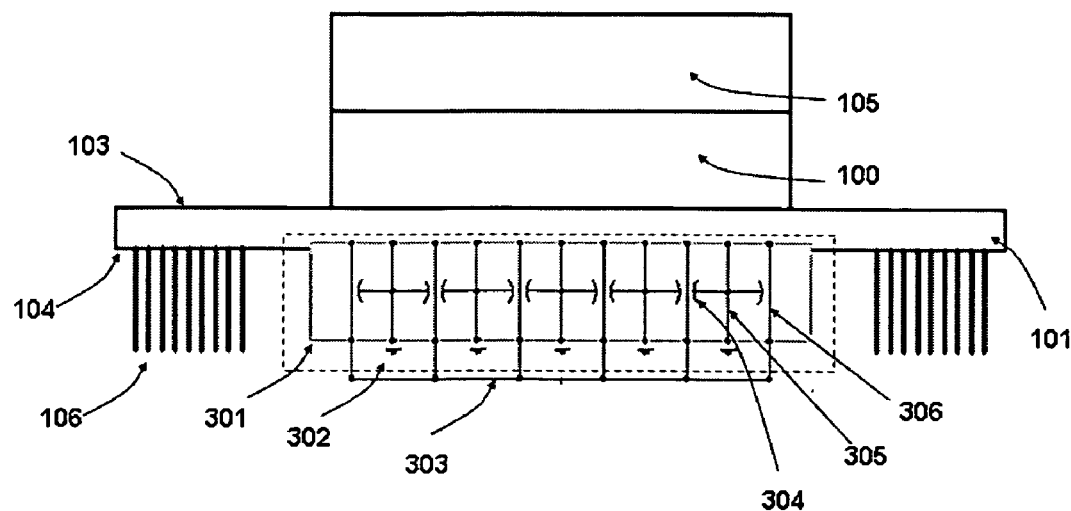
FIG. 3 is a schematic of the present invention as an interconnect with inherent capacitance.

An embodiment of the present invention is illustrated schematically in FIG. 3. In FIG. 3, a microprocessor, 100, is mounted on an upper face, 103, of a chipboard, 101. Multiple capacitor assemblies, 301, with electrode plates arranged to carry the "power", 303, and "ground" connections, 302, through it, to the bottom face, 104, of the chipboard, 101, termination, is mounted on the lower face, 104, of the chipboard. The capacitance within this chip is created by stacking the electrodes in a plane that is vertical to the plane defined by the chipboard, 101. With the internal electrode planes utilized as interconnects to "power", 306, and "ground" 305, this device becomes part of the circuit proper of the processor, and it eliminates the need for additional or appendaged interconnection to the decoupling capacitance, because the capacitance is inherent within the device. The "power" and "ground" connections (106 of FIGS. 2 and 3) through the pin or solder ball connections are no longer required.

Figure 4:
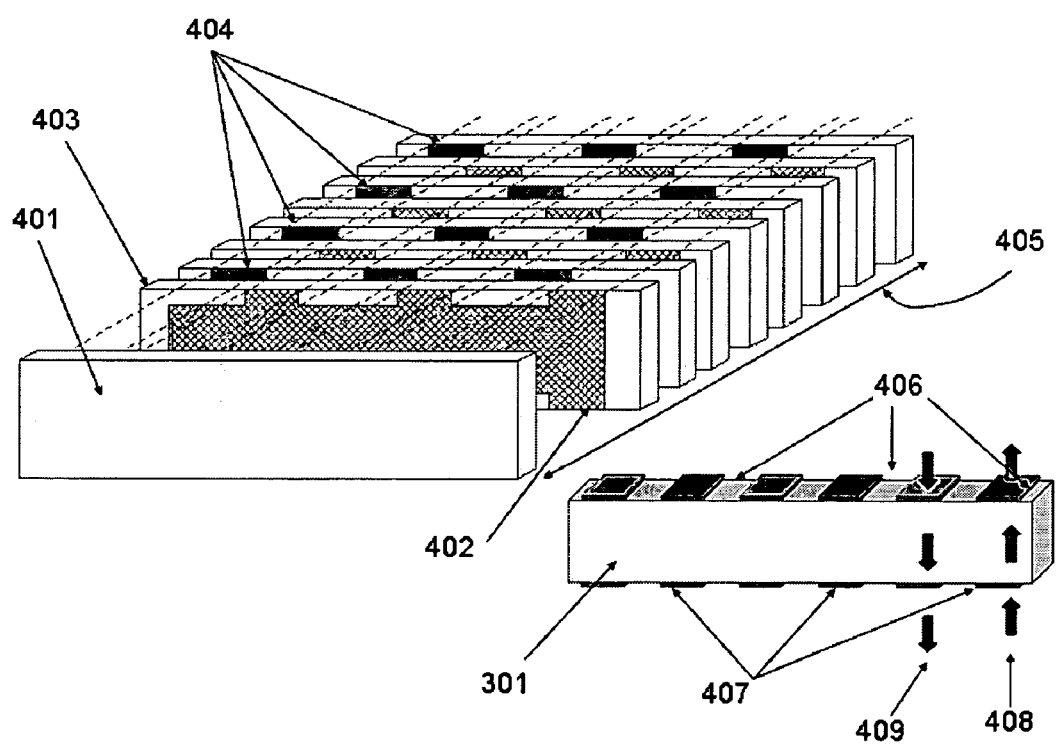
FIG. 4 is a diagram of the present invention as an assembly view and as a completed element.

The invention is built as in FIG. 4. Individual dielectric layers or material, 401, are stacked in a multilayer fashion with the electrode patterns, 402, creating the capacitive layers and edge connectors at the top and bottom of the device. The electrode pattern, 402, is created to allow the multiple edge connectors on the same plate to terminate to non-adjacent termination pads, 406 or 407, with adjacent termination pads connecting to adjacent electrode layers. The stacking arrangement is completed to as maximum a depth, 405, as possible. The stacked layers are then pressed (and fired if ceramic) into a singular element, 301, referred to herein as subunits. Termination pads at the top and bottom faces of the element are formed as known in the art. The termination pads are created as metallic contacts that allow connection to the circuit as well as connecting the non-adjacent electrodes of the stack, 404, into a common or parallel arrangement. The common electrical state of the opposing termination pads is preferred for two purposes: 1.) to allow the shortest possible path for the current to feed through the device and, 2.) to allow the shortest possible path for heat conduction through the device. The current feed in (408) and out (409) through the device is shown.

Figure 5:
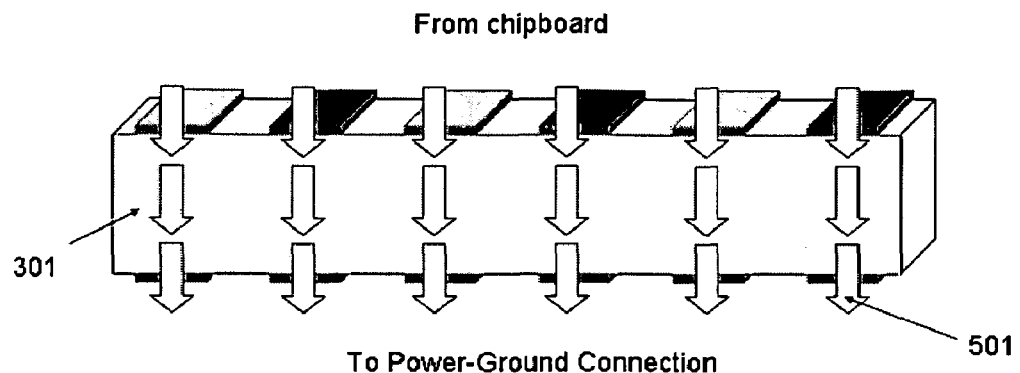
FIG. 5 is a diagram detailing the thermal transfer properties of the present invention.

Heat dissipation for the previous art illustrated in FIG. 2 was limited mainly to the dissipative capability of the heat sink, 105, attached to the top face of the silicon microprocessor. The fine interconnects through the bottom of the silicon, through the dispersive pattern within the chipboard to the pins, allowed for very little heat transfer out of the bottom of the silicon chip, 100. This device, 301, offers a thermal path, 501, directly through the capacitor as the electrode planes can act like heat sink paths to pull heat out of the bottom of the device as shown in FIG. 5. A thermal transfer block or heat sink could be connected to all the power or all the ground contacts. Connecting to all power and all ground would require the power or ground to be electrically insulated from each other.

Figure 6:
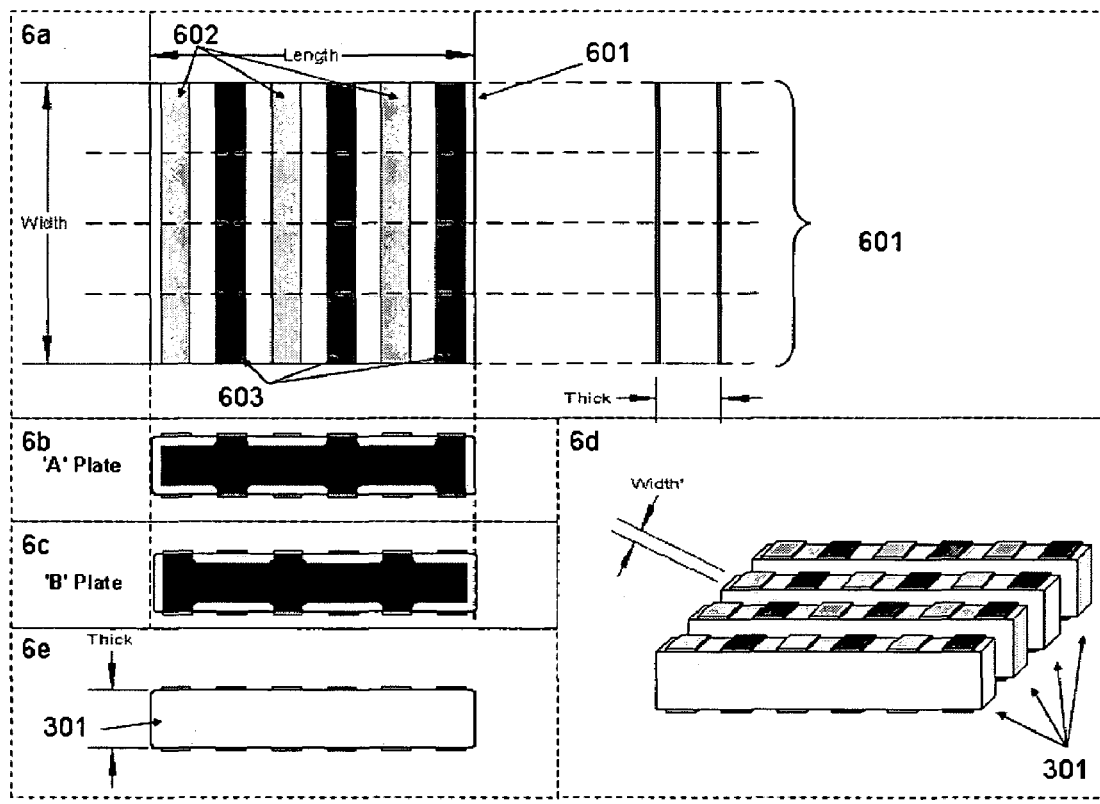
FIG. 6 is a diagram of a capacitor wherein 6a illustrates an assembly with striped terminations with top and side views; 6b and 6c illustrate the alternating plates.

The requirements of decoupling the higher energy processors demand a great deal of current and a substantial amount of capacitance. As such, the inventive device may not be sufficient to handle the current through the limited pad arrangements on each face, but they could be mounted as multiple singular elements, or as assembled multiple units. In FIG. 6(a), four elements, 301, distinguished by dotted lines, are bonded together to create a larger device, 601, with broader linear contacts, 602 and 603. This assembly can be created by bonding multiple units, 301, together after each element has reached a final state, or assembled before the termination pads are applied. For ceramic chips, this could even be created with green chips using the ceramic slurry as an adhesive before the final sintering for the ceramic dielectric. The plate designs, typically referred to as "A" and "B" plates, are illustrated in FIGS. 6(b) and 6(c) which, when taken together, form the internal electrode plates of the element, 310. Four subunits are illustrated in FIG. 6(d) which are taken together to form the capacitor of FIG. 6(a).

The subunits are typically about 1 to 2 mm wide and 1 to 4 mm thick (excluding termination pads) and 4 to 8 mm long. Typically about 3 to 6 subunits are combined into a capacitor with about 4 being preferred. The termination pads are separated by a sufficient distance to avoid arcing between pads. A separation of at least about 0.5 mm is preferred with at least about 1 mm being more preferred.

Figure 7:
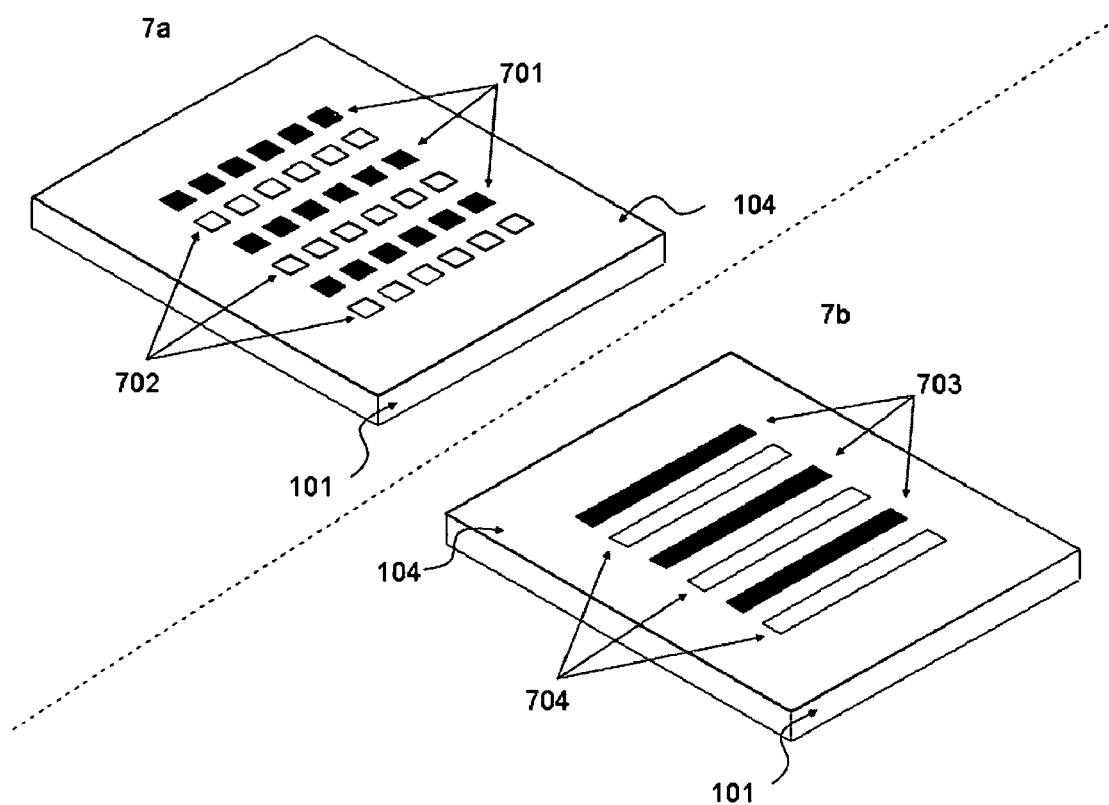
FIG. 7 illustrates a capacitor of the present invention wherein 7a is a diagram of the pad arrangement on the bottom of the chipboard for attachment of the striped assembly; and 7b illustrates the pad arrangement with the strip assembly applied thereto.

The termination pads as they would appear on the bottom side, 104, of the chipboard, 101, might appear as in FIG. 7(a). The pads could be an arrangement of rows of individual pads, 701, that are of the same polarity (power or ground), and adjacent rows would be of the opposite polarity, 702. To enable the multiple "power" and "ground" terminal contacts, this pattern is repeated to fulfill the required attachments (number of termination pads per element). The individual pads could be replaced by striped termination pads as illustrated in FIG. 7(b). where each terminal contact is an elongated pad, 703 and 704, for "ground" and "power" connections. This is defined herein as a linear arrangement.

Figure 8:
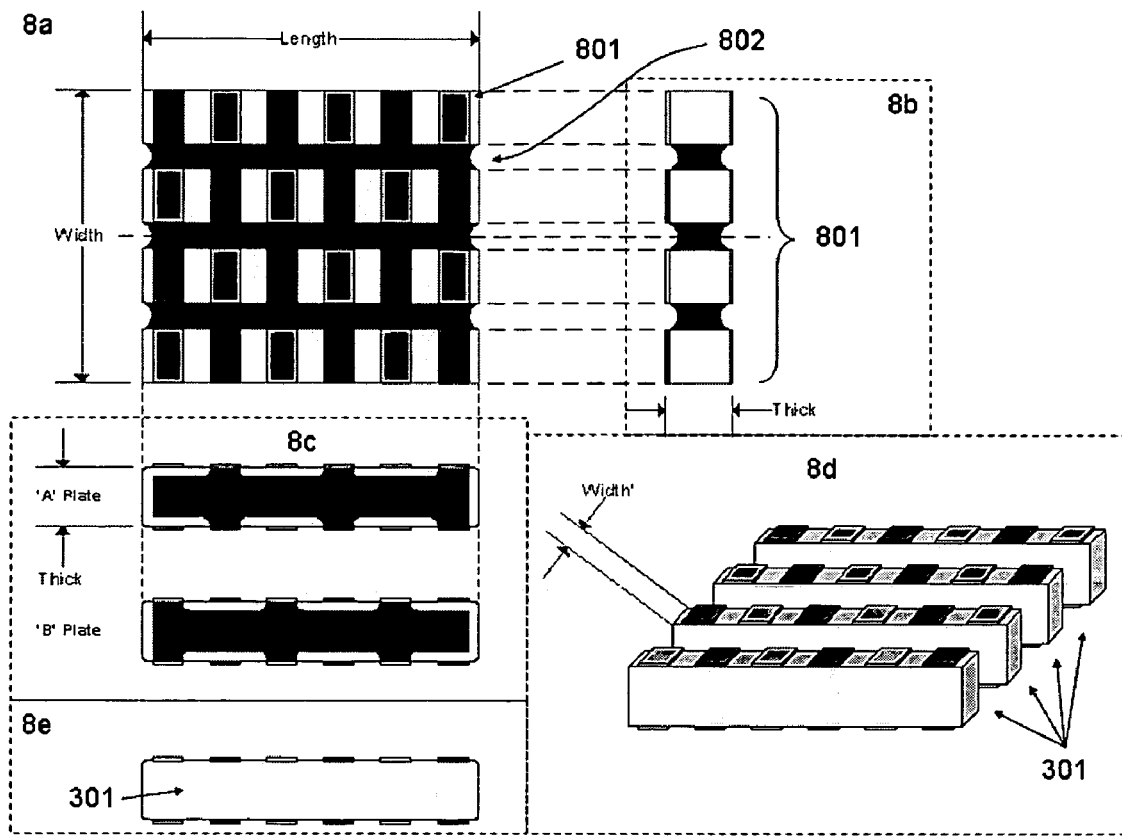
FIG. 8 is a diagram of a capacitor of the present invention wherein 8a illustrates an assembly with matrixed, fully interdigitated terminations, top view; 8b is a side view of the capacitor; 8c illustrates the alternating plates; 8d illustrates the four subunits stacked arrangement to form the full matrix assembly; and 8e is an 'on end' view of the assembly.

In FIG. 8(a), the assembly, 801, of individual elements, 301, has a bonding agent, 802, between the elements to allow a separation or isolation of the termination pads from one element to the other. This arrangement would allow for a fully interdigitated matrix of "power" and "ground" termination pads for the assembly, 801. The capacitor of FIG. 8(a) is shown in side view in FIG. 8(b).

Figure 9:
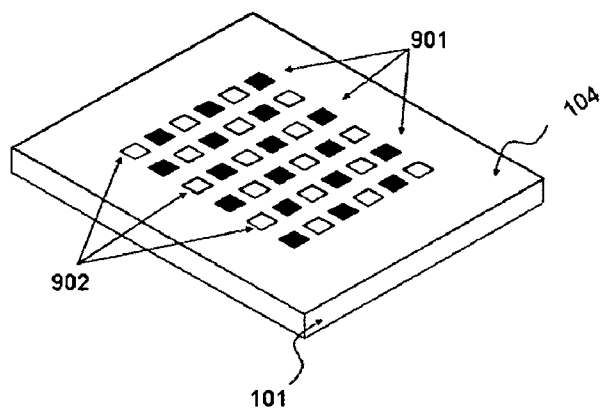
FIG. 9 is a diagram of the pad arrangement on the bottom of the chipboard for attachment of the matrixed, fully interdigitated assembly.

In FIG. 9, the pad arrangement at the bottom face, 104, of the chipboard, 101, would appear as an alternating arrangement, or "checker board", pattern with the "power" and "ground" attachments defined as shown, 901 and 902, respectively.

The dielectric layers may have any desired mean grain size. By limiting the dielectric material to the above-defined composition, there are obtained fine crystal grains which typically have a mean grain size of about 0.2 to about 0.7 μm.

The dielectric layers have an appropriate Curie temperature which is determined in accordance with the applicable standards by suitably selecting a particular composition of dielectric material. Typically the Curie temperature is higher than 45° C., especially about 65° C. to 125° C.

Each dielectric layer preferably has a thickness of up to about 50 µm, more preferably up to about 20 µm. The lower limit of thickness is about 0.5 µm, preferably about 2 µm. The present invention is effectively applicable to multilayer ceramic chip capacitors having such thin dielectric layers for minimizing a change of their capacitance with time. The number of dielectric layers stacked is generally from 2 to about 300, preferably from 2 to about 200.

The conductor which forms the internal electrode layers is not critical, although a base metal preferably is used since the dielectric material of the dielectric layers has anti-reducing properties. Typical base metals are nickel and nickel alloys. Preferred nickel alloys are alloys of nickel with at least one member selected from Mn, Cr, Co, and Al, with such nickel alloys containing at least 95 wt % of nickel being more preferred. It is to be noted that nickel and nickel alloys may contain up to about 0.1 wt % of phosphorous and other trace components.

The thickness of the internal electrode layers may be suitably determined in accordance with a particular purpose and application although its upper limit is typically about 5 µm, preferably about 2.5 µm, and its lower limit is typically about 0.5 µm, preferably about 1 µm.

The conductor which forms the external electrodes is not critical, although inexpensive metals such as nickel, copper, and alloys thereof are preferred. The thickness of the external electrodes may be suitably determined in accordance with a particular purpose and application although it generally ranges from about 10 µm to about 50 µm.

The multilayer ceramic chip capacitor of the present invention generally is fabricated by forming a green chip by conventional printing and sheeting methods using pastes, firing the chip, and printing or transferring external electrodes thereto followed by baking.

Paste for forming the dielectric layers can be obtained by mixing a raw dielectric material with an organic vehicle. The raw dielectric material may be a mixture of oxides and composite oxides as previously mentioned. Also useful are various compounds which convert to such oxides and composite oxides upon firing. These include, for example, carbonates, oxalates, nitrates, hydroxides, and organometallic compounds. The dielectric material is obtained by selecting appropriate species from these oxides and compounds and mixing them. The proportion of such compounds in the raw dielectric material is determined such that after firing, the specific dielectric layer composition may be met. The raw dielectric material is generally used in powder form having a mean particle size of about 0.1 to about 3 µm, preferably about 1 µm.

The organic vehicle is a binder in an organic solvent. The binder used herein is not critical and may be suitably selected from conventional binders such as ethyl cellulose. Also the organic solvent used herein is not critical and may be suitably selected from conventional organic solvents such as terpineol, butylcarbinol, acetone, and toluene in accordance with a particular application method such as a printing or sheeting method.

Paste for forming internal electrode layers is obtained by mixing an electro-conductive material with an organic vehicle. The conductive material used herein includes conductors such as conductive metals and alloys as mentioned above and various compounds which convert into such conductors upon firing, for example, oxides, organometallic compounds and resinates. The organic vehicle is as mentioned above.

Paste for forming external electrodes is prepared by the same method as the internal electrodes layer-forming paste.

No particular limit is imposed on the organic vehicle content of the respective pastes mentioned above. Often the paste contains about 1 to 5 wt % of the binder and about 10 to 50 wt % of the organic solvent. If desired, the respective pastes may contain any other additives such as dispersants, plasticizers, dielectric compounds, and insulating compounds. The total content of these additives is preferably up to about 10 wt %.

A green chip then may be prepared from the dielectric layer-forming paste and the internal electrode layer-forming paste. In the case of printing method, a green chip is prepared by alternately printing the pastes onto a substrate of polyethylene terephthalate (PET), for example, in laminar form, cutting the laminar stack to a predetermined shape and separating it from the substrate.

Also useful is a sheeting method wherein a green chip is prepared by forming green sheets from the dielectric layer-forming paste, printing the internal electrode layer-forming paste on the respective green sheets, and stacking the printed green sheets.

The binder is then removed from the green chip and fired. Binder removal may be carried out under conventional conditions, preferably under the following conditions where the internal electrode layers are formed of a base metal conductor such as nickel and nickel alloys.

Heating rate: 5 to 300° C./hour, more preferably 10 to 100° C./hour. Holding temperature: 200 to 400° C., more preferably 250 to 300° C. Holding time: ½ to 24 hours, more preferably 5 to 20 hours, Atmosphere: air. The green chip is then fired in an atmosphere which may be determined in accordance with the type of conductor in the internal electrode layer-forming paste. Where the internal electrode layers are formed of a base metal conductor such as nickel and nickel alloys, the firing atmosphere may have an oxygen partial pressure of $10^{-8}$ to $10^{-12}$ atm. Extremely low oxygen partial pressure should be avoided, since at such low pressures the conductor can be abnormally sintered and may become disconnected from the dielectric layers. At oxygen partial pressures above the range, the internal electrode layers are likely to be oxidized.

For firing, the chip preferably is held at a temperature of 1,100° C. to 1,400° C., more preferably 1,250 to 1,400° C. Lower holding temperatures below the range would provide insufficient densification whereas higher holding temperatures above the range can lead to poor DC bias performance. Remaining conditions for sintering preferably are as follows. Heating rate: 50 to 500° C./hour, more preferably 200 to 300° C./hour. Holding time: ½ to 8 hours, more preferably 1 to 3 hours. Cooling rate: 50 to 500° C./hour, more preferably 200 to 300° C./hour. The firing atmosphere preferably is a reducing atmosphere. An exemplary atmospheric gas is a humidified mixture of $N_2$ and $H_2$ gases.

Firing of the capacitor chip in a reducing atmosphere preferably is followed by annealing. Annealing is effective for re-oxidizing the dielectric layers, thereby optimizing the resistance of the ceramic to dielectric breakdown. The annealing atmosphere may have an oxygen partial pressure of at least $10^{-6}$ atm., preferably $10^{-5}$ to $10^{-4}$ atm. The dielectric layers are not sufficiently re-oxidized at a low oxygen partial pressures below the range, whereas the internal electrode layers are likely to be oxidized at oxygen partial pressures above this range.

For annealing, the chip preferably is held at a temperature of lower than 1,100° C., more preferably 500° C. to 1,000° C. Lower holding temperatures below the range would oxidize the dielectric layers to a lesser extent, thereby leading to a shorter life. Higher holding temperatures above the range can cause the internal electrode layers to be oxidized (leading to a reduced capacitance) and to react with the dielectric material (leading to a shorter life). Annealing can be accomplished simply by heating and cooling. In this case, the holding temperature is equal to the highest temperature on heating and the holding time is zero. Remaining conditions for annealing preferably are as follows.

Holding time: 0 to 20 hours, more preferably 6 to 10 hours. Cooling rate: 50 to 500° C./hour, more preferably 100 to 300° C./hour The preferred atmospheric gas for annealing is humid nitrogen gas. The nitrogen gas or a gas mixture used in binder removal, firing, and annealing, may be humidified using a wetter. In this regard, water temperature preferably is about 5 to 75° C.

The binder removal, firing, and annealing may be carried out either continuously or separately. If done continuously, the process includes the steps of binder removal, changing only the atmosphere without cooling, raising the temperature to the firing temperature, holding the chip at that temperature for firing, lowering the temperature to the annealing temperature, changing the atmosphere at that temperature, and annealing.

If done separately, after binder removal and cooling down, the temperature of the chip is raised to the binder-removing temperature in dry or humid nitrogen gas. The atmosphere then is changed to a reducing one, and the temperature is further raised for firing. Thereafter, the temperature is lowered to the annealing temperature and the atmosphere is again changed to dry or humid nitrogen gas, and cooling is continued. Alternately, once cooled down, the temperature may be raised to the annealing temperature in a nitrogen gas atmosphere. The entire annealing step may be done in a humid nitrogen gas atmosphere.

The resulting chip may be polished at end faces by barrel tumbling and sand blasting, for example, before the external electrode-forming paste is printed or transferred and baked to form external electrodes. Firing of the external electrode-forming paste may be carried out under the following conditions: a humid mixture of nitrogen and hydrogen gases, about 600 to 800° C., and about 10 minutes to about 1 hour.

Pads are preferably formed on the external electrodes by plating or other methods known in the art.

The multilayer ceramic chip capacitors of the invention can be mounted on printed circuit boards, for example, by soldering.

The present invention has been described with particular reference to the preferred embodiments. It would be apparent from the description herein that other embodiments could be realized without departing from the scope of the invention which is set forth in the claims appended hereto.

The invention claimed is:

1. An electrical component comprising:
a printed circuit board comprising an upper face and a lower face
a microprocessor mounted to said upper face;
a capacitor mounted to said lower face wherein said capacitor comprises:
a first face parallel to said printed circuit board and a second face opposite to said first face;
first plates and second plates in alternating planar relationship with a dielectric therebetween;
each first plate of said first plates comprises a first coupling tab and a power tab on opposing edges wherein said first coupling tab terminates at said first face and said power tab terminates at said second face;
each second plate of said second plates comprises a second coupling tab and a ground tab on opposing edges wherein said second coupling tab terminates at said first face and said ground tab terminates at said second face;
wherein said first coupling tab and said second coupling tab are in electrical contact with said microprocessor.

2. The electrical component of claim 1 wherein each said first plate comprises a multiplicity of power tabs and a multiplicity of first coupling tabs.

3. The electrical component of claim 2 wherein each power tab terminates at said second face.

4. The electrical component of claim 1 wherein said first plates and said second plates are substantially perpendicular to said printed circuit board.

5. The electrical component of claim 1 wherein said capacitor comprises subunits wherein each subunit comprises first coupling tabs, second coupling tabs, power tabs and ground tabs.

6. The electrical component of claim 5 further comprising first external coupling terminations in electrical contact with said first coupling tabs and second external coupling terminations in electrical contact with said second coupling tabs.

7. The electrical component of claim 6 wherein said first external coupling terminations are linearly coupled.

8. The electrical component of claim 6 wherein said first external coupling terminations and said second external coupling terminations are alternating.

9. The electrical component of claim 1 wherein said capacitor is attached to said printed circuit board by a ball grid array.

10. The electrical component of claim 1 wherein said capacitor is attached to said printed circuit board by a solder strip.

11. The electrical component of claim 1 wherein said first coupling tab and said power tab are opposing.

12. An electrical component comprising:
a printed circuit board comprising an upper face and a lower face
a microprocessor mounted to said upper face;
a subunit mounted to said lower face wherein said subunit comprises:
a first face parallel to said printed circuit board and a second face opposite to said first face;
first plates and second plates in alternating planar relationship with a dielectric therebetween;
each first plate of said first plates comprises a first coupling tab and a power tab on opposing edges wherein said first coupling tab terminates at said first face and said power tab terminates at said second face;
each second plate of said second plates comprises a second coupling tab and a ground tab on opposing edges wherein said second coupling tab terminates at said first face and said ground tab terminates at said second face;
wherein said first coupling tab and said second coupling tab are in electrical contact with said microprocessor.

13. The electrical component of claim 12 comprising multiple subunits.

14. The electrical component of claim 13 wherein said subunits are combined to form a capacitor.

15. The electrical component of claim 14 wherein said capacitor comprises ceramic between said subunits.

16. The electrical component of claim 14 wherein said first coupling tabs of each subunit are aligned.

17. The electrical component of claim 14 wherein said first coupling of each subunit and said second coupling of each subunit are alternating.

18. An electrical component comprising:
a printed circuit board comprising power terminals and ground terminals;
a capacitor mounted on said printed circuit board wherein said capacitor comprises:
alternating first plates and second plates with a dielectric between said first plates and second plates wherein said first plates and said second plates are perpendicular to said printed circuit board;
wherein said first plates comprise power lead out tabs terminating at power external terminals and coupling lead out tabs terminating at first coupling terminals wherein said power external terminals are in electrical contact with said power terminals; and
said second plates comprise ground tabs terminating at ground external terminals and second coupling tabs terminating at second coupling terminals wherein said ground external terminals are in electrical contact with said ground terminals;
a chipboard with said capacitor mounted thereon comprising power coupling terminals in electrical contact with said first coupling terminal and ground coupling terminals in electrical contact with said second coupling terminals.

19. The electrical component of claim 18 wherein said power lead out tabs and said ground tabs are in alternating arrangement.

20. The electrical component of claim 19 wherein said capacitor is mounted to said printed circuit board by a ball grid array.

21. The electrical component of claim 18 wherein said power lead out tabs are aligned and said ground tabs are aligned.

22. The electrical component of claim 21 wherein said capacitor is mounted to said printed circuit board by a solder strip.

23. The electrical component of claim 18 further comprising a microprocessor mounted on said printed circuit board.

24. The electrical component of claim 23 wherein said printed circuit board is between said microprocessor and said capacitor.

25. The electrical component of claim 18 further comprising a heat sink.

26. A capacitor comprising:
a first face and a second face parallel to said first face and four sides perpendicular to and between said first face and said second face;
subunits wherein each subunit of said subunits comprises:
first plates and second plates in alternating planar relationship with a dielectric therebetween;
each first plate of said first plates comprises a first coupling tab and a power tab on opposing edges wherein said first coupling tab terminates at said first face and said power tab terminates at said second face;
each second plate of said second plates comprises a second coupling tab and a ground tab on opposing edges wherein said second coupling tab terminates at said first face and said ground tab terminates at said second face; and
wherein said subunits are fused together with ceramic between said subunits.

27. The capacitor of claim 26 wherein said first coupling tabs of each subunit are aligned.

28. The capacitor of claim 26 wherein said first coupling tabs of each subunit and said second coupling tabs of each subunit are alternating.

29. A capacitor comprising:
a pair of opposing faces;
subunits wherein:
each subunit comprises a multiplicity of first plates and second plates in alternating parallel relationship and perpendicular to said opposing faces;
said first plates comprise first lead out tabs which terminate at a first external terminal at a first face;
said second plates comprise second lead out tabs which terminate at a second external terminal at said first face;
a first external terminal in contact with said first lead out tabs;
a second external terminal in contact with said second lead out tabs;
said subunits are arranged in parallel such that said first external terminals and said second external terminals are on said first face.

30. The capacitor of claim 29 wherein said first external terminal of each said subunit are aligned.

31. The capacitor of claim 29 wherein said first external terminal is in electrical contact with a first external terminal of a second said subunit.

32. The capacitor of claim 29 wherein said first external terminal of each said subunit and said second external terminal of each said subunit are alternating.

33. The capacitor of claim 29 wherein each of said first plates comprises third lead out tabs which terminate at a third external terminal on a second face.

34. The capacitor of claim 33 wherein each of said second plates comprises fourth lead out tabs which terminate at a fourth external terminal on said second face.

35. The capacitor of claim 34 wherein said third external terminal and said fourth external terminal are aligned.

36. The capacitor of claim 35 wherein said third external terminal and said fourth external terminal are alternating.

37. The capacitor of claim 36 wherein said first external terminal and said third external terminal are opposing.

38. The capacitor of claim 37 wherein said first externalterminal and saidfourth external terminal are opposing.

* * * * *